(12) United States Patent  (10) Patent No.: US 8,072,041 B2
Dimitrov  (45) Date of Patent: Dec. 6, 2011

(54) PASSIVATED OPTICAL DETECTORS WITH FULL PROTECTION LAYER

(75) Inventor: Roman Dimitrov, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 114 days.

(21) Appl. No.: 12/420,316

(22) Filed: Apr. 8, 2009

(65) Prior Publication Data

US 2010/0258896 A1   Oct. 14, 2010

(51) Int. Cl.
  *H01L 31/00* (2006.01)
  *H01L 31/101* (2006.01)
  *H01L 21/02* (2006.01)
  *H01L 21/00* (2006.01)

(52) U.S. Cl. . 257/459; 257/437; 257/462; 257/E31.082; 257/E31.097; 257/E31.102; 438/69; 438/72

(58) Field of Classification Search .............. 438/57–98; 257/431–466, 618–628, E31.082, E31.097, 257/E31.102
  See application file for complete search history.

(56) References Cited

U.S. PATENT DOCUMENTS

| | | | | |
|---|---|---|---|---|
| 4,999,696 A * | 3/1991 | Gentner et al. | ............... | 257/458 |
| 5,063,426 A * | 11/1991 | Chandrasekhar et al. | .... | 257/458 |
| 5,448,099 A * | 9/1995 | Yano | ............................. | 257/452 |
| 5,479,032 A * | 12/1995 | Forrest et al. | .................. | 257/190 |
| 6,228,673 B1 * | 5/2001 | Loo et al. | ......................... | 438/57 |
| 6,326,649 B1 * | 12/2001 | Chang et al. | ..................... | 257/184 |
| 6,586,718 B2 * | 7/2003 | Matsuda | .................... | 250/214.1 |
| 6,593,635 B2 * | 7/2003 | Yanagisawa et al. | ......... | 257/458 |
| 6,800,914 B2 | 10/2004 | Ito et al. | | |
| 2002/0131011 A1* | 9/2002 | Izumi | ............................. | 349/199 |
| 2002/0185641 A1* | 12/2002 | Mohri | ............................. | 257/11 |
| 2003/0038306 A1* | 2/2003 | Izumi et al. | .................... | 257/222 |
| 2005/0012030 A1* | 1/2005 | Mahajan et al. | ........... | 250/214.1 |
| 2006/0038191 A1* | 2/2006 | Onishi et al. | ..................... | 257/96 |
| 2006/0273421 A1* | 12/2006 | Yasuoka et al. | .................. | 257/438 |
| 2007/0045668 A1* | 3/2007 | Brady et al. | .................. | 257/219 |
| 2008/0001245 A1* | 1/2008 | Yoneda et al. | ................ | 257/458 |
| 2008/0150118 A1* | 6/2008 | Van Veen et al. | ............. | 257/688 |
| 2009/0020841 A1* | 1/2009 | Hu et al. | ........................ | 257/442 |

* cited by examiner

*Primary Examiner* — Michael Lebentritt
*Assistant Examiner* — Karen Kusumakar
(74) *Attorney, Agent, or Firm* — Maschoff Gilmore & Israelsen

(57) ABSTRACT

In one example, an optoelectronic transducer includes a first contact, a second contact, a passivation layer, and a protection layer. The passivation layer is formed on top of the first contact and the second contact and is configured to substantially minimize dark current in the optoelectronic transducer. The protection layer is formed on top of the passivation layer and substantially covers the passivation layer. The protection layer is configured to protect the passivation layer from external factors and prevent degradation of the passivation layer.

20 Claims, 7 Drawing Sheets

PASSIVATED OPTICAL DETECTORS WITH FULL PROTECTION LAYER

BACKGROUND OF THE INVENTION

1. Field of the Invention

The present invention generally relates to high-speed optoelectronic transducers. In particular, some example embodiments relate to mesa-type optical detectors that include a protection layer substantially covering a passivation layer and configured to substantially prevent degradation of the passivation layer.

2. Related Technology

Optical detectors are commonly employed for converting optical signals to electrical signals in a variety of applications. Such optical detectors are used, for instance, in connection with optical transmitters to monitor the output power of an optical signal produced by the optical transmitter, and as optical receivers to convert an incoming optical data signal into an electrical data signal in a communications network.

Optical receivers in communications networks are typically configured to operate at certain signaling rates, such as 1 Gigabit per second ("Gbit/s"), 2 Gbit/s, 4 Gbit/s, 10 Gbit/s, 40 Gbit/s, 100 Gbit/s, and above. The highest signaling rate at which an optical receiver can operate at is limited by the capacitance of the optical receiver, which is related to the size of the optical receiver's active region. In particular, higher capacitance in optical receivers with relatively larger active regions limits the use of such optical receivers to low-speed applications. In contrast, lower capacitance in optical receivers with relatively smaller active regions allows such optical receivers to be used in high-speed applications. In other words, faster data rates require optical receivers with smaller active regions.

One type of optical receiver adapted for high-speed applications is the mesa-type optical detector. The active region of a mesa-type optical detector can be minimized by forming a multi-layered semiconductor structure on a substrate and etching through various layers of the semiconductor structure to form a mesa. The mesa thus formed defines the diameter of the optical detector's active region, which at least partially determines the data rate capabilities of the optical detector. By way of example, the active region diameter of some 4 Gbit/s optical detectors is approximately 50 microns, while the active region diameter of some 10 Gbit/s optical detectors is approximately 30 microns.

In the course of forming the mesa, defects and/or discontinuities are typically created in the layers of the semiconductor structure along the mesa line. Exposure of the mesa surfaces to air oxidizes the layers and creates more defects and/or discontinuities. The defects and/or discontinuities can be a source of dark current, e.g., electric current that flows through an optical detector even when no photons are entering the active region of the optical detector. The dark current adds noise to photocurrent generated during operation of the optical detector and can render an optical detector useless if it becomes too large.

To minimize dark current, a passivation layer is typically formed on the mesa as soon as possible after etching the mesa during the manufacturing process. Ideally, the passivation layer prevents the deterioration of the layers of the semiconductor structure along the mesa line and thereby stabilizes the dark current to a manageable level. In practice, the passivation layer is sensitive to air, moisture, temperature swings, chemicals, mechanical stress, and/or other external factors that degrade the passivation layer. The resulting degradation of the passivation layer allows the mesa to deteriorate, reducing the ability of the passivation layer to minimize dark current and thereby reducing the reliability of the optical detector.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF THE INVENTION

In general, example embodiments of the invention relate to an optical detector including a protection layer configured to substantially prevent degradation of an underlying passivation layer and improve reliability of the optical detector.

In one example embodiment, an optoelectronic transducer includes a first contact, a second contact, a passivation layer, and a protection layer. The passivation layer is formed on top of the first contact and the second contact. The protection layer is formed on top of the passivation layer and substantially covers the passivation layer. The protection layer is configured to protect the passivation layer from environmental factors and prevent degradation of the passivation layer.

In another example embodiment, a method of forming an optical detector begins by growing a layered semiconductor structure on a substrate. A passivation layer configured to control dark current in the optical detector is deposited on the semiconductor structure. A protection layer is deposited on the passivation layer that substantially covers the entire passivation layer. The protection layer is configured to prevent degradation of the passivation layer when the optical detector is exposed to one or more external factors, such as moisture, air, chemicals, and so on.

In yet another example embodiment, an optical detector includes a substrate, an n-type layer formed on top of the substrate, an absorption layer formed on top of the n-type layer, and a cap layer formed on top of the absorption layer. A first mesa is etched through the cap layer and absorption layer to the n-type layer. A second mesa is etched through a portion of the n-type layer exposed by etching the first mesa to the substrate. A first contact is formed on top of the cap layer. A second contact is formed on a portion of the n-type layer exposed by etching the first mesa. A passivation layer covers the at least a portion of the first contact, the first mesa, at least a portion of the second contact, and the second mesa. A protection layer substantially covers the entire passivation layer and is configured to substantially prevent exposure of the protection layer to external factors.

Additional features of the invention will be set forth in the description which follows, and in part will be obvious from the description, or may be learned by the practice of the invention. The features of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other features of the present invention, a more particular description of the invention will be rendered by reference to specific embodiments thereof which are illustrated in the appended drawings. It is appreciated that these drawings depict only typical embodi- FIGS. 1A-1G disclose various stages in the formation of an example optical detector with a protection layer according to embodiments of the invention.

DETAILED DESCRIPTION OF THE PREFERRED EMBODIMENTS

Figure 1A:
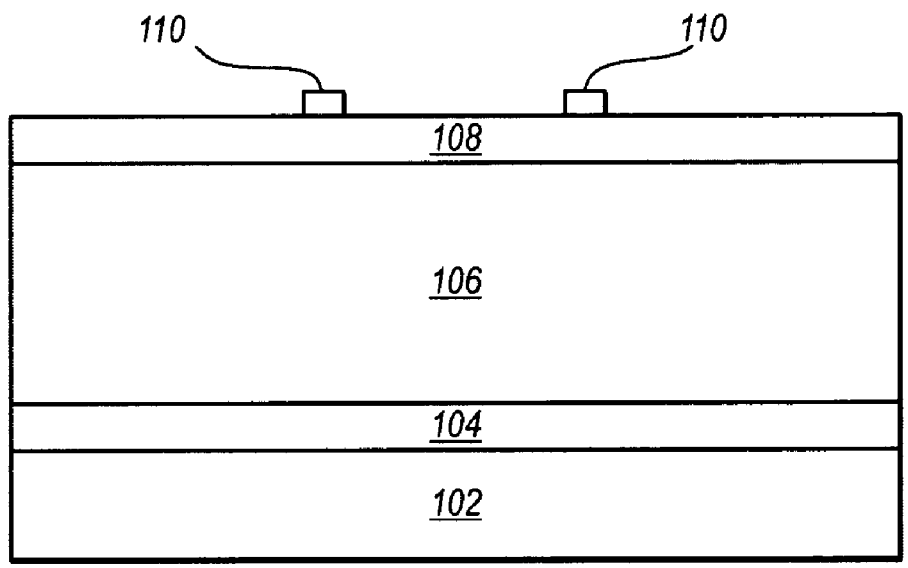

Reference will now be made to figures wherein like structures will be provided with like reference designations. It should be understood that the drawings are diagrammatic and schematic representations of exemplary embodiments of the invention, and are not limiting of the present invention, nor are the drawings necessarily drawn to scale.

I. General Aspects of Some Optical Detectors

In general, the example embodiments of this disclosure are concerned with optoelectronic transducers implemented so as to facilitate an improvement in the reliability of the optoelectronic transducers. More particularly, the disclosed example embodiments are configured such that they include a protection layer adapted to reduce sensitivity to the environment and/or other external factors, thereby improving aging performance.

It should be noted that, as contemplated herein, the term "optoelectronic transducers" is intended to broadly embrace any device capable of converting an optical signal to an electrical signal. Devices with this capability are sometimes referred to as being photosensitive. Consistent with the foregoing, optoelectronic transducers embrace, among other things, optical detectors such as monitor photodiodes ("MPDs") used to monitor optical signal strength of an optical transmitter, and optical receivers used to convert optical data signals to electrical data signals. Both optical detectors and optical receivers may be employed in optical communication systems, devices and networks. Note that optical detectors may alternatively be referred to as "photodetectors." Some examples of such optical communication systems, devices and networks include, but are not limited to, optical subassemblies ("OSAs"), such as receiver optical subassemblies ("ROSAs") and transmitter optical subassemblies ("TOSAs"), as well as various types of modules such as transmitter modules, receiver modules, transceiver modules, and transponder modules.

As indicated herein, examples of the disclosed optoelectronic transducers may be employed in connection with optical communication networks. The scope of the invention is not limited to any particular network type, protocol, wavelength or data rate, however, and, more generally, embodiments of the invention can be employed with a wide variety of different network types, protocols, wavelengths and/or data rates.

In some implementations, an example optoelectronic transducer can be employed in an optical communication system, device and/or network having a data rate of up to about 2.5 Gb/s, 4 Gb/s, 10 Gb/s, or higher. Other example optoelectronic transducers may be employed in connection with data rates of 40 Gb/s, 100 Gb/s, or higher. Examples of optical signal wavelengths in connection with which some embodiments of the invention may be employed include, but are not limited to, the nominal wavelengths 850 nm, 1280 nm, 1310 nm, and 1550 nm.

Similarly, some of the example optoelectronic transducers disclosed herein may be employed in connection with a variety of different data transfer protocols. Examples of such protocols include, but are not limited to, Ethernet, Gigabit Ethernet, the various OC-X protocols, SONET, and Fibre Channel. Correspondingly, the modules in connection with which the disclosed example optoelectronic transducers may be employed may conform with any of a variety of MSAs. Such MSAs include, but are not limited to, the GBIC, SFP, SFF and XFP MSAs.

II. Aspects of Some Example Embodiments

Reference is first made to FIGS. 1A-1G, which disclose various stages in an example process for manufacturing an optical detector 100 (FIG. 1G) according to embodiments of the invention. First, as illustrated in FIG. 1A, a substrate 102 is prepared that can include, but is not limited to, semi-insulating indium phosphide ("InP").

On the main surface of the substrate 102, various layers are sequentially grown, including n-type layer 104, absorption layer 106, p-type cap layer 108, and first contact 110. The n-type layer 104 can include, but is not limited to, n-type InP crystal. The absorption layer 106 can include, but is not limited to, undoped indium gallium arsenide ("InGaAs") crystal. The cap layer 108 can include, but is not limited to, p-type InGaAs crystal. The first contact 110 can include a metal stack comprising titanium, platinum, gold, or the like or any combination thereof. The semiconductor layers 104, 106, 108 can be formed using epitaxial methods, such as molecular beam epitaxy ("MBE"), or the like.

Figure 1B:
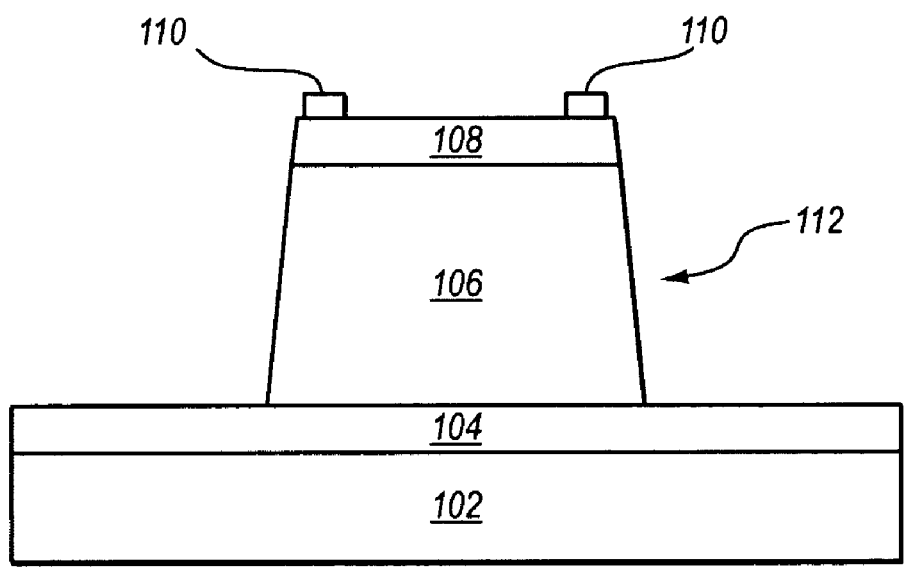

Next, as illustrated in FIG. 1B, a first mesa 112 is formed. The first mesa 112 can be formed by masking the upper portion of the first contact 110 and cap layer 108, using a photolithographically patterned photo resist or dielectric film like silicon oxide and nitride. After the masking, the cap layer 108 and absorption layer 106 can be isotropically etched to form the first mesa 112.

Figure 1C:
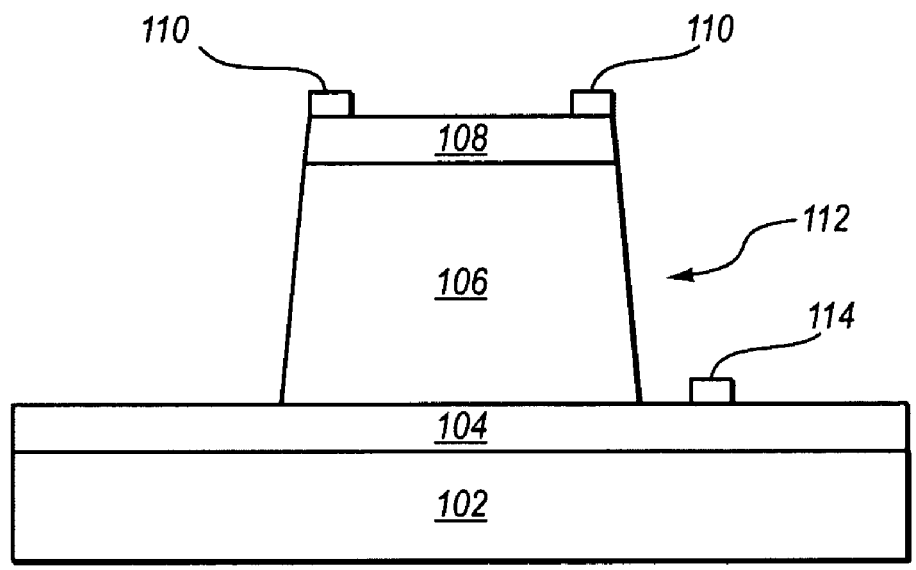

Following formation of the first mesa 112, a second contact 114 is formed on the n-type layer 104, as best seen in FIG. 1C. The second contact 114 can include, for example, a metal stack suitable for n-type contact, such as gold-germanium, nickel, platinum, gold, or the like or any combination thereof.

Figure 1D:
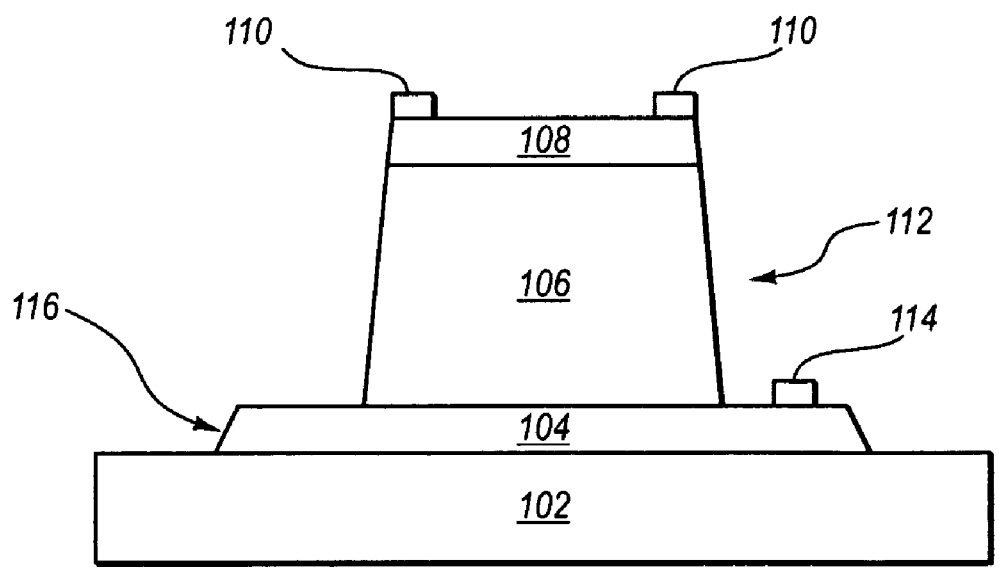

Next, as illustrated in FIG. 1D, a second mesa 116 is formed. The second mesa 116 can be formed in some embodiments by application of a photo-resist film over the first contact 110, cap layer 108, first mesa 112, second contact 114, and part of the n-type layer 104. Once the photo-resist film is applied, isotropic etching of the n-type layer 104 can be accomplished to form the second mesa 116.

Figure 1E:
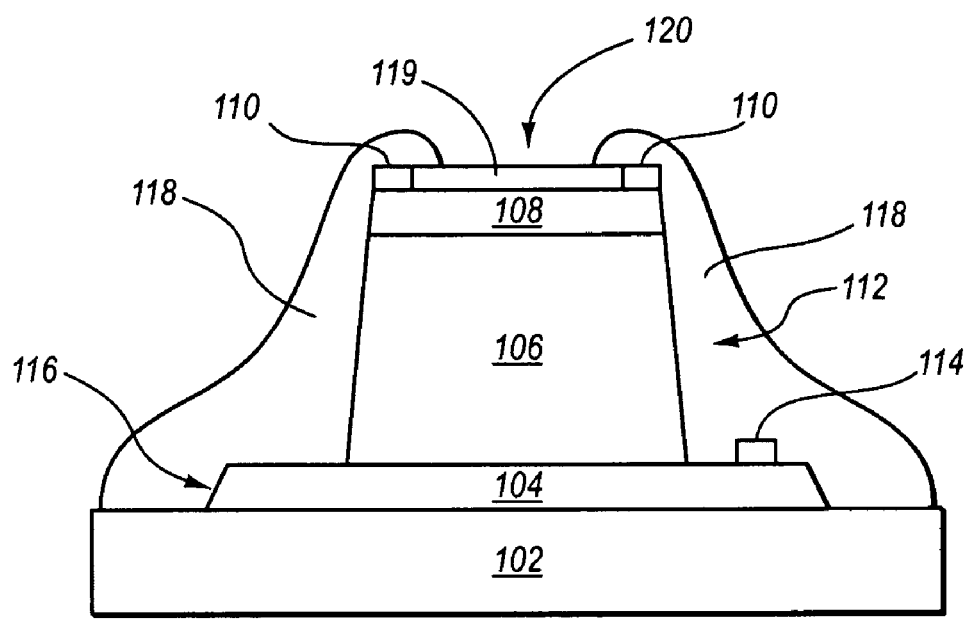

To substantially minimize, prevent, or otherwise control dark current in the optical detector 100 (FIG. 1G) formed according to embodiments of the invention, a passivation layer 118 is grown on first contact 110, first mesa 112, second contact 114, and second mesa 116, as shown in FIG. 1E. The passivation layer 118 can include polyimide, benzocyclobutene ("BCB"), or the like or any combination thereof.

Further, an anti-reflection ("A/R") coating 119 can be applied over an active region 120 of the optical detector to prevent light incident on the optical detector at the active region 120 from being back reflected. The A/R coating can include dielectric, such as silicon nitride ("SiN") or the like. In some embodiments, the A/R layer 119 is grown on top of the cap layer 108 prior to growing the passivation layer 118.

Those skilled in the art will appreciate, with the benefit of the present disclosure, that polyimide and/or BCB passivation layers are often sensitive to temperature swings and humidity. The quality of such passivation layers typically degrades if the passivation layer is exposed to environmental factors such as temperature, moisture, chemicals, etc., and/or other factors such as forces that can be exerted on the optical detector during handling or processing of the optical detector. The degradation of the passivation layer due to exposure to these and other factors can reduce the ability of the passivation layer to substantially minimize, prevent, or otherwise control dark current and thereby increase the likelihood of early failure of the optical detector.

Figure 1F:
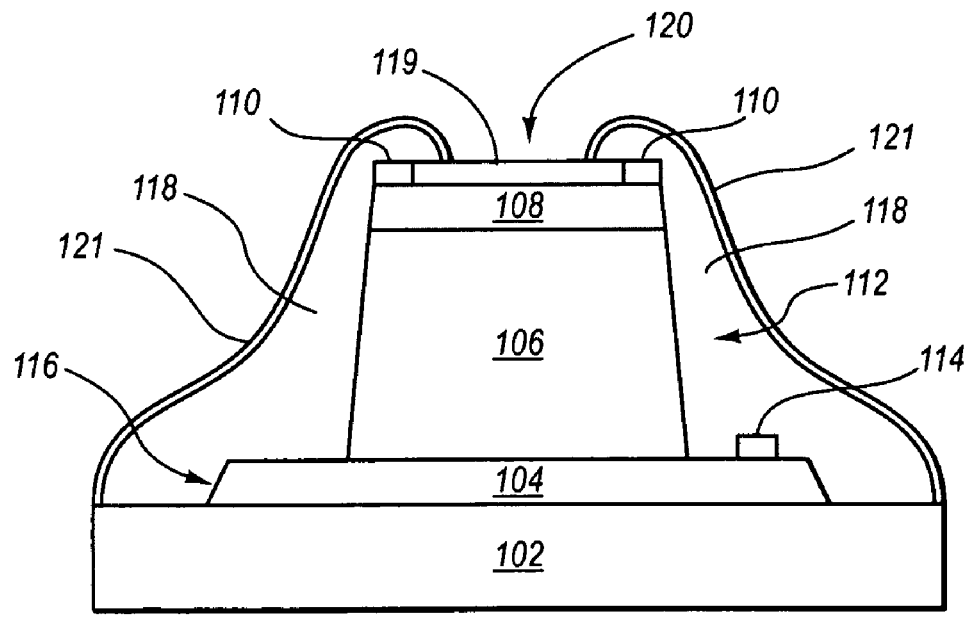

According to embodiments of the invention, however, the sensitivity of the passivation layer 118 to environmental factors can be substantially reduced by growing a protection layer 121 that substantially covers the entire passivation layer 118, as shown in FIG. 1F. The protection layer 121 can include a dielectric such as SiN, silicon dioxide ("$SiO_2$"), silicon oxygen nitride ("$SiO_xN_y$") or the like or any combination thereof. According to other embodiments of the invention, the protection layer 121 can include metal or other suitable material, as will be explained in greater detail below with respect to FIG. 4.

In some embodiments, the A/R layer 119 is grown on top of the cap layer 108 prior to growing the protection layer 121. Alternately or additionally, the protection layer 121 can be grown in such a way that it substantially covers the passivation layer 118 and the cap layer 108 and operates as an A/R layer over the active region 120, thereby eliminating a separately grown A/R layer.

Returning to FIG. 1F, the protection layer 121 is configured to reduce and/or substantially eliminate exposure of the passivation layer 118 to environmental factors, including moisture, air, temperature, and/or other factors that can degrade the quality of the passivation layer 118. As a result, the passivation layer 118 is less likely to degrade than in conventional optical detectors that lack a protection layer 121 and can continue to minimize dark current with little or no reduction in its ability to do so, improving the reliability of the optical detector.

Figure 1G:
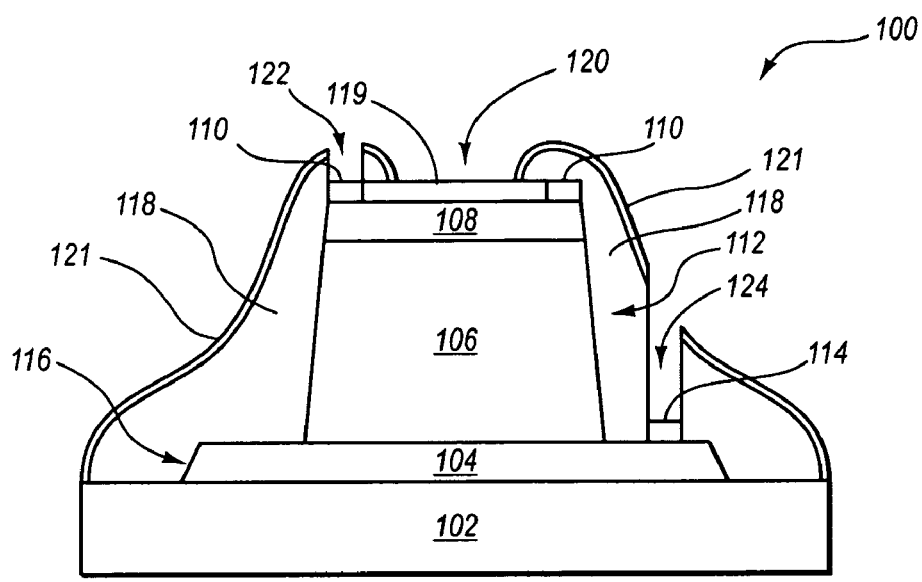

After growing the protection layer 121, a plurality of holes 122, 124 can be etched through portions of the protection layer 121 and passivation layer 118 to expose the first contact 110 and second contact 114, as disclosed in FIG. 1G. In the process of etching the holes 122, 124, portions of the passivation layer 118 can be exposed. However, metal and/or other electrically conductive materials can be deposited in the holes 122, 124 to enable the first contact 110 and second contact 114 to be coupled to a power source and to cover the exposed portions of the passivation layer 118. The metal can be deposited using an evaporation method, or the like, and can include gold, tin, or the like or any combination thereof.

Figure 2A:
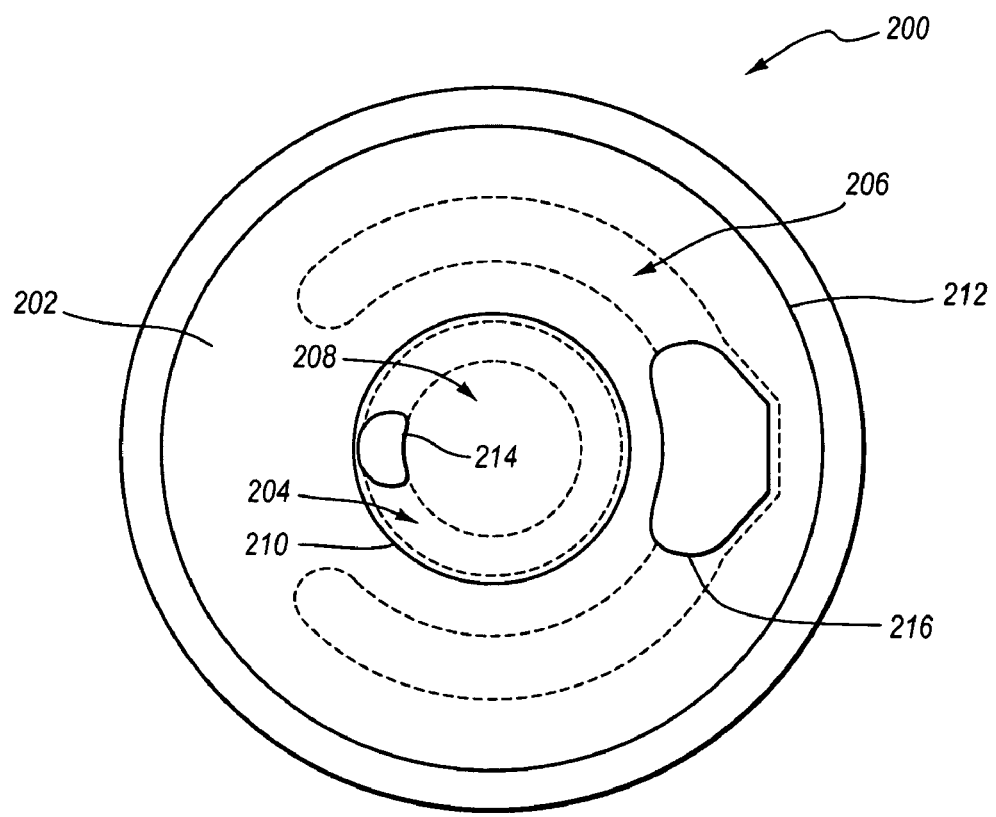
FIGS. 2A-2C disclose two top views and a perspective view of an embodiment of an optical detector with a protection layer.
Figure 2B:
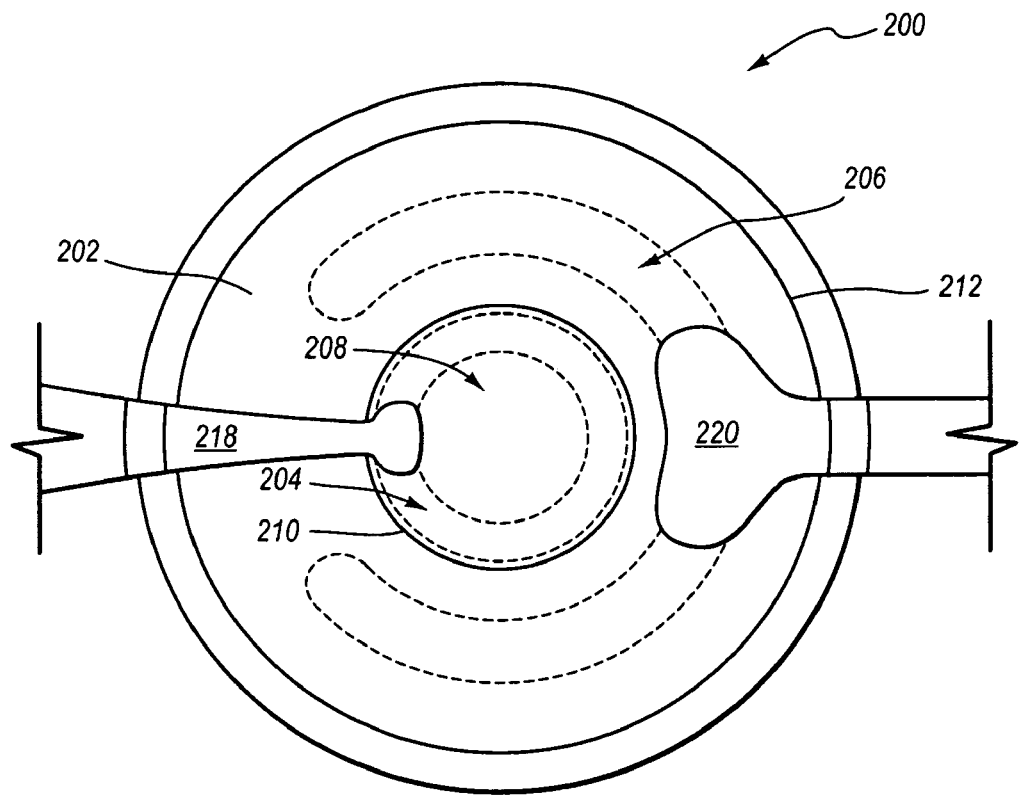
Figure 2C:
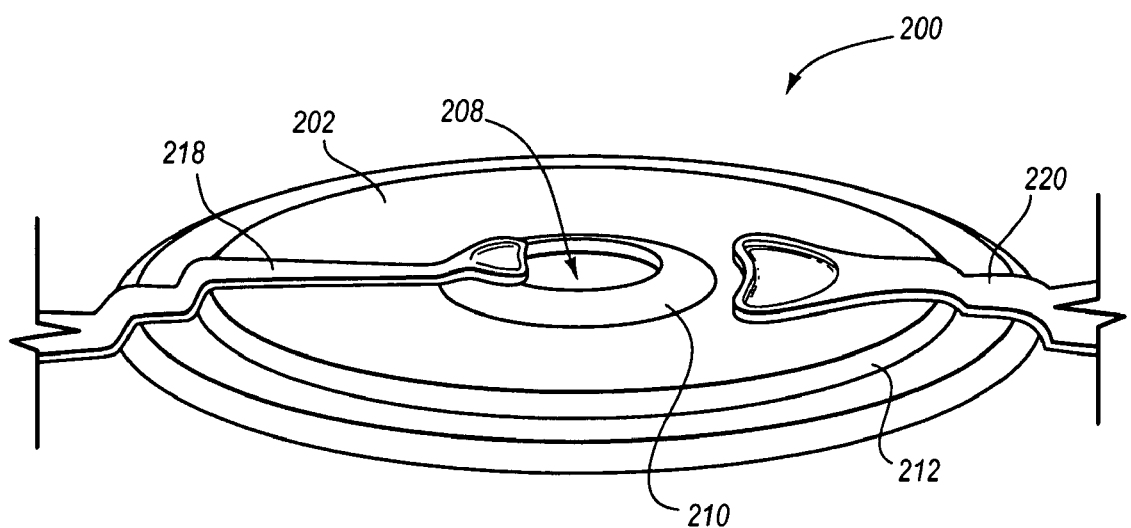

Turning now to FIGS. 2A-2C, various views of an example optical detector 200 formed according to embodiments of the invention are disclosed. FIG. 2A discloses an overhead view of example optical detector 200 at the processing stage disclosed in FIG. 1G. Although much of the surface of the optical detector 200 is covered by a protection layer 202, corresponding to the protection layer 121 of FIGS. 1A-1G, various aspects of the optical detector 200 are nevertheless apparent.

For example, the optical detector 200 includes a first contact 204 and second contact 206 underneath the protection layer 202 that may correspond to the first contact 110 and second contact 114 of FIGS. 1A-1G. The ring-shaped first contact 204 defines an aperture through which light can enter an active region 208. The optical detector 200 further includes a first mesa 210 and second mesa 212, both of which are disposed beneath the protection layer 202 and a passivation layer (not shown). Although not shown, the passivation layer is disposed beneath the protection layer 202 and covers the first and second contacts 204, 206 and first and second mesas 210, 212.

A plurality of holes 214, 216 are disclosed in FIG. 2A that have been etched through the protection layer 202 and the passivation layer and that may correspond to the holes 122 and 124 of FIG. 1G. In particular, the hole 214 allows metal to be deposited onto the portion of the first contact 204 exposed by the hole 214 and the hole 216 allows metal to be deposited onto the portion of the second contact 206 exposed by the hole 216 in order to form contact pads for the optical detector 200, as shown in FIGS. 2B and 2C, respectively disclosing an overhead view and a perspective view of the optical detector 200 and contact pads 218, 220.

In particular, in the embodiment of FIGS. 2B and 2C, a plurality of contact pads 218, 220 have been formed from pad metal deposited in the holes 214, 216 of FIG. 2A and on other portions of the optical detector 200. As shown, the pad metal of contact pads 218, 220 has been deposited in the holes 214, 216 to allow electrical communication with the first contact 204 and second contact 206 and to further cover portions of the passivation layer disposed beneath the protection layer 202 that may have been exposed when the holes 214, 216 were etched.

As already mentioned above, the protection layer 202 is configured to reduce the sensitivity of the optical detector 200, and more particularly of the passivation layer beneath the protection layer 202, to environmental and other factors. Accordingly, optical detectors that include passivation layers substantially covered by a protection layer and/or metal contact pads can be exposed to one or more external factors that might otherwise degrade the passivation layer and reduce the reliability of the optical detector. For example, such optical detectors can be immersed in, cleaned with, or otherwise exposed to water, chemicals, or the like or any combination thereof, without degrading the passivation layer. Alternately or additionally, the protection layer can protect the passivation layer from forces that are exerted on the optical detectors during handling and/or processes such as substrate polishing. Accordingly, embodiments of the invention allow the implementation of optical detectors with a protection layer in non-hermetic applications.

Notably, conventional wisdom teaches against the formation of a protection layer comprising dielectric on top of a passivation layer in mesa-type optical detectors since the dielectric can exert pressure on the passivation layer or otherwise stress the passivation layer and thereby degrade the passivation layer. The degradation to the passivation layer can reduce the reliability of the optical detector as the ability of the passivation layer to minimize dark current in the optical detector decreases with increasing degradation to the passivation layer.

Contrary to conventional wisdom, however, populations of mesa-type optical detectors having a passivation layer substantially covered by a protection layer comprising dielectric according to embodiments of the invention prove to be more reliable, rather than less reliable, than conventional mesa-type optical detectors having an exposed passivation layer. For instance, aging data for two populations of optical detectors having a passivation layer and a protection layer is disclosed in FIGS. 3A and 3B. The dark current in the optical detectors of each of the two populations stabilized after relatively short aging times to levels within acceptable limits, e.g., an increase of less than 2 micro-amps ("μA"), due to the reduced sensitivity of the optical detectors to the external factors resulting from the protection of the passivation layer with a protection layer. It is appreciated that the stabilization of the dark current in the optical detectors directly affects the reliability of the optical detectors, as increasing dark current with age can ultimately render an optical detector useless.

Figure 3A:
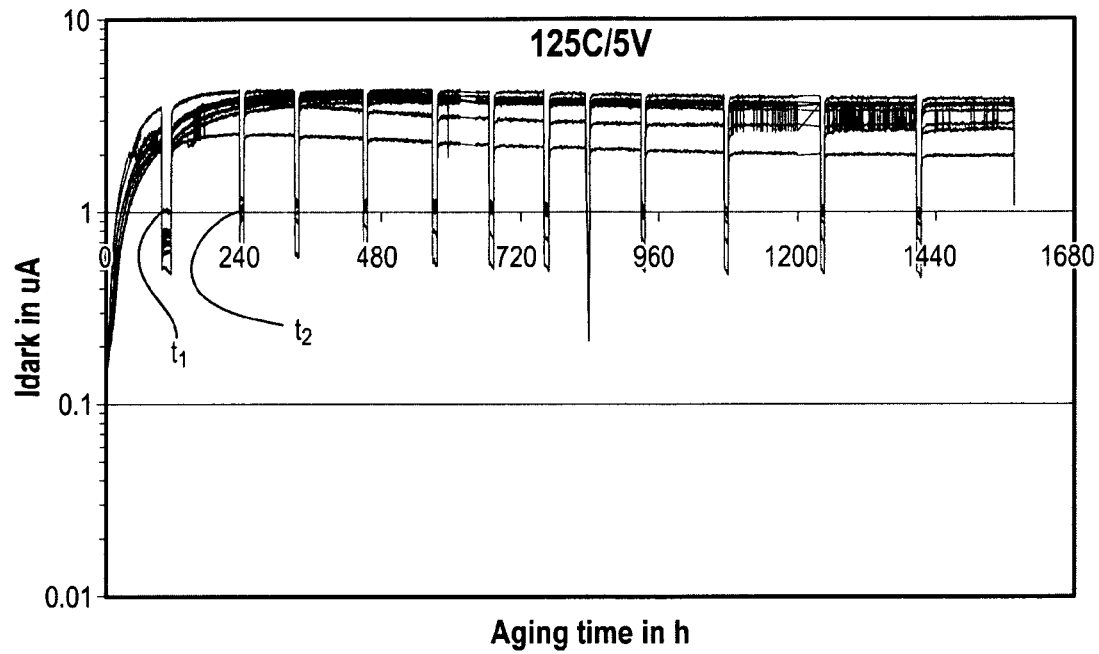
FIGS. 3A and 3B disclose accelerated aging data obtained from two populations of optical detectors with a protection layer.
Figure 3B:
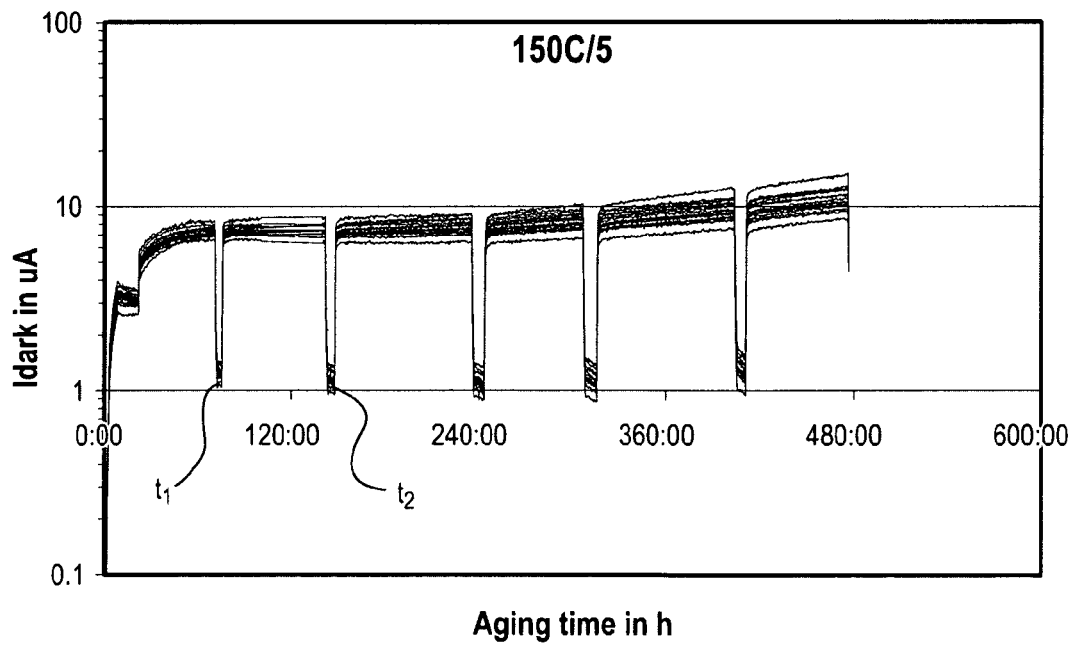

More particularly, FIG. 3A discloses aging data for a first population of optical detectors aged at a temperature of 125° C. and a bias voltage of 5V while FIG. 3B discloses aging data for a second population of optical detectors aged at a temperature of 150° C. and a bias voltage of 5V. Each of the optical detectors in the first and second populations were mesa-type optical detectors with a passivation layer covering the mesas and a dielectric protection layer substantially covering the passivation layer.

The dark current in each of the optical detectors of the first and second populations was measured in real-time. Without removing the bias voltage, the temperature was periodically lowered to 90° C., which represents the highest operating temperature of the optical detectors in normal use. The temperature was periodically lowered to 90° C. for brief times, e.g., 10 minutes, at times $t_1$, $t_2$, etc. in FIG. 3A and times $t_1$, $t_2$, etc. in FIG. 3B, in order to judge the performance of the photodiodes in the most stressed corner of operating conditions. Each time the temperature was lowered, the dark current measured in each of the optical detectors dropped sharply and then rose quickly to the previous high after the original temperature (125° C. or 150° C. respectively) was re-applied.

The dark current measured in the first population of optical detectors aged at 125° C. stabilized after approximately 240 hours, as shown in FIG. 3A. The dark current measured in the second population of optical detectors aged at 150° C. stabilized after approximately 50 hours, as shown in FIG. 3B. In contrast, the dark current in conventional mesa-type optical detectors lacking a dielectric protection layer substantially covering the passivation layer typically continues to increase, due to degradation of the passivation layer, until it reaches a level that interferes with the receiver sensitivity of the optical detectors and renders the optical detectors unusable. Accordingly, in some embodiments of the invention the reliability of optical detectors can be improved by substantially covering the passivation layer of the optical detectors with a dielectric protection layer.

Although discussed in the context of an optical detector with a protection layer comprising dielectric, embodiments of the invention can alternately or additionally be implemented in optical detectors with a protection layer comprising other reasonable materials, such as metal. For instance, FIG. 4 discloses an alternative embodiment of a mesa-type optical detector 400 that includes a passivation layer substantially covered by a metal protection layer.

Figure 4:
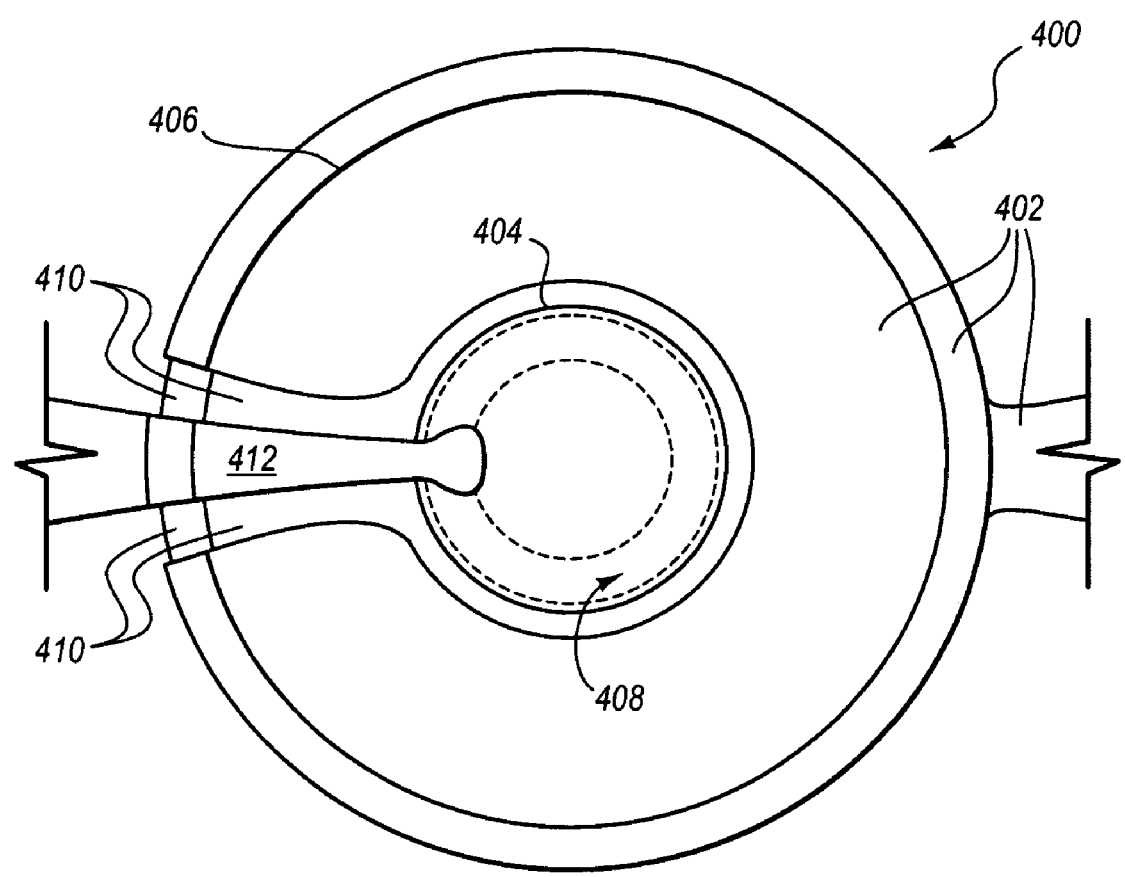
FIG. 4 discloses a top view of another embodiment of an optical detector with a protection layer.

The optical detector 400 of FIG. 4 includes a metal protection layer 402, a first mesa 404, a second mesa 406, a first contact 408, a second contact (not shown), and a passivation layer 410 covering the first mesa 404, second mesa 406, first contact 408, and the second contact. The passivation layer 410 is substantially covered by the metal protection layer 402. Although not shown, the optical detector 400 further includes a plurality of holes etched through the passivation layer 410 to facilitate electrical communication with the first contact 408 and second contact. To that end, a first contact pad 412 can be formed by depositing pad metal in one hole onto the first contact 408. A second contact pad comprising the metal protection layer 402 can be formed by depositing pad metal in the other hole onto the second contact, the pad metal additionally substantially covering the passivation layer 410.

According to the embodiment of FIG. 4, the metal protection layer 402 substantially covers the entire passivation layer 410, except for a small exposed portion proximate the first contact pad 412 and first contact 408. The metal protection layer 402 is not formed in the exposed portion of the passivation layer 410 to avoid a short circuit in the optical detector 400 during operation. According to other embodiments of the invention, the portion of the passivation layer 410 not covered by the metal protection layer 402, or by the first contact pad 412, can be covered by a non-metallic protection layer, such as dielectric, to ensure that the passivation layer 410 is entirely covered by metal protection layer 402, first contact pad 412, and the non-metallic protection layer in combination.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic transducer, comprising:
   an optoelectronic transducer structure having a first contact and a second contact;
   a passivation layer including a polyimide material formed on top of at least a portion of the first contact and on top of at least a portion of the second contact; and
   a protection layer formed on top of the passivation layer to substantially cover the passivation layer and configured to protect the passivation layer from external factors.

2. The optoelectronic transducer of claim 1, further comprising an opening etched downward through the protection layer and the passivation layer above each of the first contact and the second contact, each of the openings exposing a portion of the passivation layer.

3. The optoelectronic transducer of claim 2, further comprising, first pad metal deposited onto the first contact through the etched opening above the first contact, and second pad metal deposited onto the second contact through the etched opening above the second contact, wherein the first pad metal and second pad metal substantially cover the portions of the passivation layer exposed by the etched openings.

4. The optoelectronic transducer of claim 1, wherein the protection layer includes one or more of: silicon nitride, silicon dioxide, or silicon oxygen nitride.

5. The optoelectronic transducer of claim 1, further comprising a first mesa and a second mesa formed in the optoelectronic transducer beneath the passivation layer.

6. The optoelectronic transducer of claim 1, wherein the protection layer includes metal and is configured to enable the first or second contact to be coupled to a power source.

7. The optoelectronic transducer of claim 1, wherein the polyimide material is benzocyclobutene ("BCB").

8. A method of forming an optical detector, the method comprising:
   growing a layered semiconductor structure on a substrate;
   depositing a passivation layer including a polyimide material on the semiconductor structure, the passivation layer configured to control dark current in the optical detector; and
   depositing a protection layer on the passivation layer that substantially covers the entire passivation layer, the protection layer configured to substantially prevent degradation of the passivation layer when the optical detector is exposed to one or more external factors.

9. The method of claim 8, further comprising, prior to depositing the passivation layer:
forming a first mesa on the semiconductor structure extending from a top of the semiconductor structure to a first layer of the semiconductor structure; and
forming a second mesa on the semiconductor structure extending from the first layer to the substrate.

10. The method of claim 9, further comprising:
prior to forming the first mesa, forming a first contact on the top of the semiconductor structure; and
prior to forming the second mesa, forming a second contact on the first layer.

11. The method of claim 10, further comprising, forming a first opening through the protection layer and the passivation layer to the first contact, and forming a second opening through the protection layer and the passivation layer to the second contact, the first and second openings allowing the first and second contacts to be coupled to a power source.

12. The method of claim 11, further comprising:
depositing first pad metal into the first opening, the first pad metal forming a first contact pad and substantially covering a first portion of the passivation layer exposed during the formation of the first opening; and
depositing second pad metal into the second opening, the second pad metal forming a second contact pad and substantially covering a second portion of the passivation layer exposed during the formation of the second opening.

13. The method of claim 8, further comprising, exposing the optical detector to one or more external factors.

14. The method of claim 13, wherein the one or more external factors include at least one of: air, moisture, a chemical, or a force.

15. An optical detector, comprising:
a substrate;
an n-type layer formed on top of the substrate;
an absorption layer formed on top of the n-type layer;
a cap layer formed on top of the absorption layer;
a first mesa etched through the cap layer and absorption layer to the n-type layer;
a second mesa etched through the n-type layer to the substrate;
a first contact formed on top of the cap layer;
a second contact formed on a portion of the n-type layer exposed by etching the first mesa;
a passivation layer including a polyimide material covering at least a portion the first contact, the first mesa, at least a portion of the second contact and the second mesa; and
a protection layer substantially covering the entire passivation layer and configured to substantially prevent exposure of the passivation layer to one or more external factors.

16. The optical detector of claim 15, wherein the polyimide material is BCB.

17. The optical detector of claim 15, wherein the protection layer includes one or more of: dielectric, silicon nitride, silicon oxide, silicon oxygen nitride, or metal.

18. The optical detector of claim 15, wherein the protection layer covers the cap layer and is further configured to prevent light incident on the optical detector from being back reflected.

19. The optical detector of claim 15, further comprising an opening etched downward through the protection layer and the passivation layer above each of the first contact and the second contact, each of the openings exposing a portion of the passivation layer.

20. The optical detector of claim 19, further comprising, first pad metal deposited onto the first contact through the etched opening above the first contact, and second pad metal deposited onto the second contact through the etched opening above the second contact, wherein the first pad metal and second pad metal substantially cover portions of the passivation layer exposed by the etched openings.

* * * * *